United States Patent [19]
Aden et al.

[11] Patent Number: 5,379,005
[45] Date of Patent: Jan. 3, 1995

[54] FLAT CABLE TO FLAT PARALLEL WIRE CABLE

[75] Inventors: Charles M. Aden; Martin H. Graham, both of Berkeley; Matthew Taylor, Pleasant Hill; Mark Miller, Oakland, all of Calif.

[73] Assignee: Tut Systems, Inc., Pleasant Hill, Calif.

[21] Appl. No.: 92,721

[22] Filed: Jul. 16, 1993

[51] Int. Cl.⁶ .............................. H03H 7/42
[52] U.S. Cl. ........................ 333/24 R; 333/25
[58] Field of Search .............. 333/24 R, 25, 1, 4, 333/5; 375/36, 7

[56] References Cited

U.S. PATENT DOCUMENTS

| | | | |
|---|---|---|---|
| 3,612,744 | 10/1971 | Thomas | 333/238 |
| 3,761,842 | 9/1973 | Gandrud | 333/1 |
| 3,949,169 | 4/1976 | Braecklmann | 333/109 |
| 4,222,016 | 9/1980 | Stock et al. | 333/24 |
| 4,717,896 | 1/1988 | Graham | |
| 4,751,607 | 6/1988 | Smith | 333/25 |
| 4,800,344 | 1/1989 | Graham | |
| 4,999,594 | 3/1991 | Ingman | 333/181 |
| 5,003,579 | 3/1991 | Jones | |
| 5,095,291 | 3/1992 | Staschover et al. | 375/36 |
| 5,121,090 | 6/1992 | Garuts et al. | 333/25 |
| 5,191,300 | 3/1993 | Graham | |

FOREIGN PATENT DOCUMENTS 0166838  7/1991  Japan ................ 375/36

Primary Examiner—Robert J. Pascal
Assistant Examiner—Darius Gambino
Attorney, Agent, or Firm—Blakely, Sokoloff, Taylor & Zafman

[57] ABSTRACT

A LAN which uses flat telephone cable having at least four conductors. The inner conductors are joined together and the outer conductors are joined together at each node thereby making reversals of the inner and outer conductors, which may occur at connectors, impossible. Each node uses two baluns to provide an unbalanced zone between the baluns for connecting to the DTE.

8 Claims, 3 Drawing Sheets

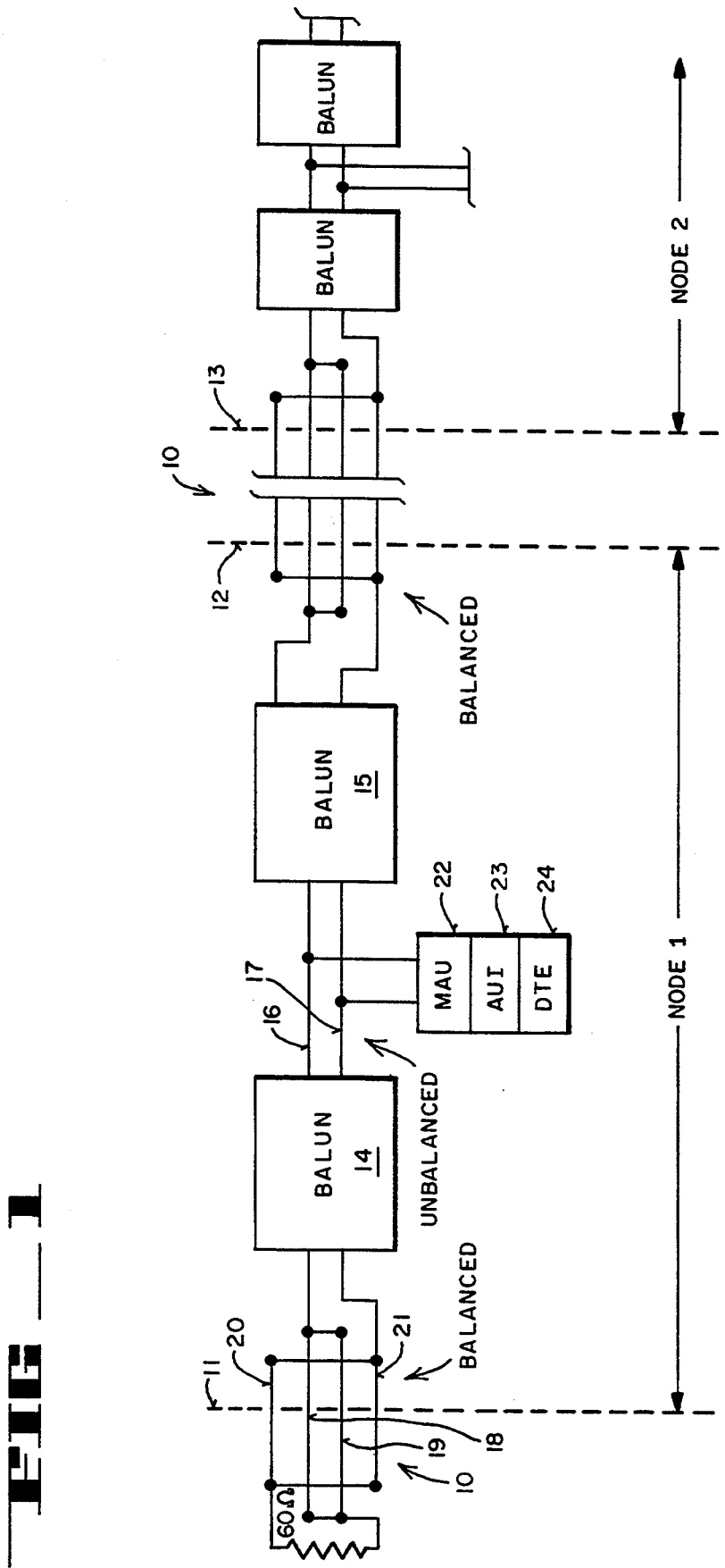

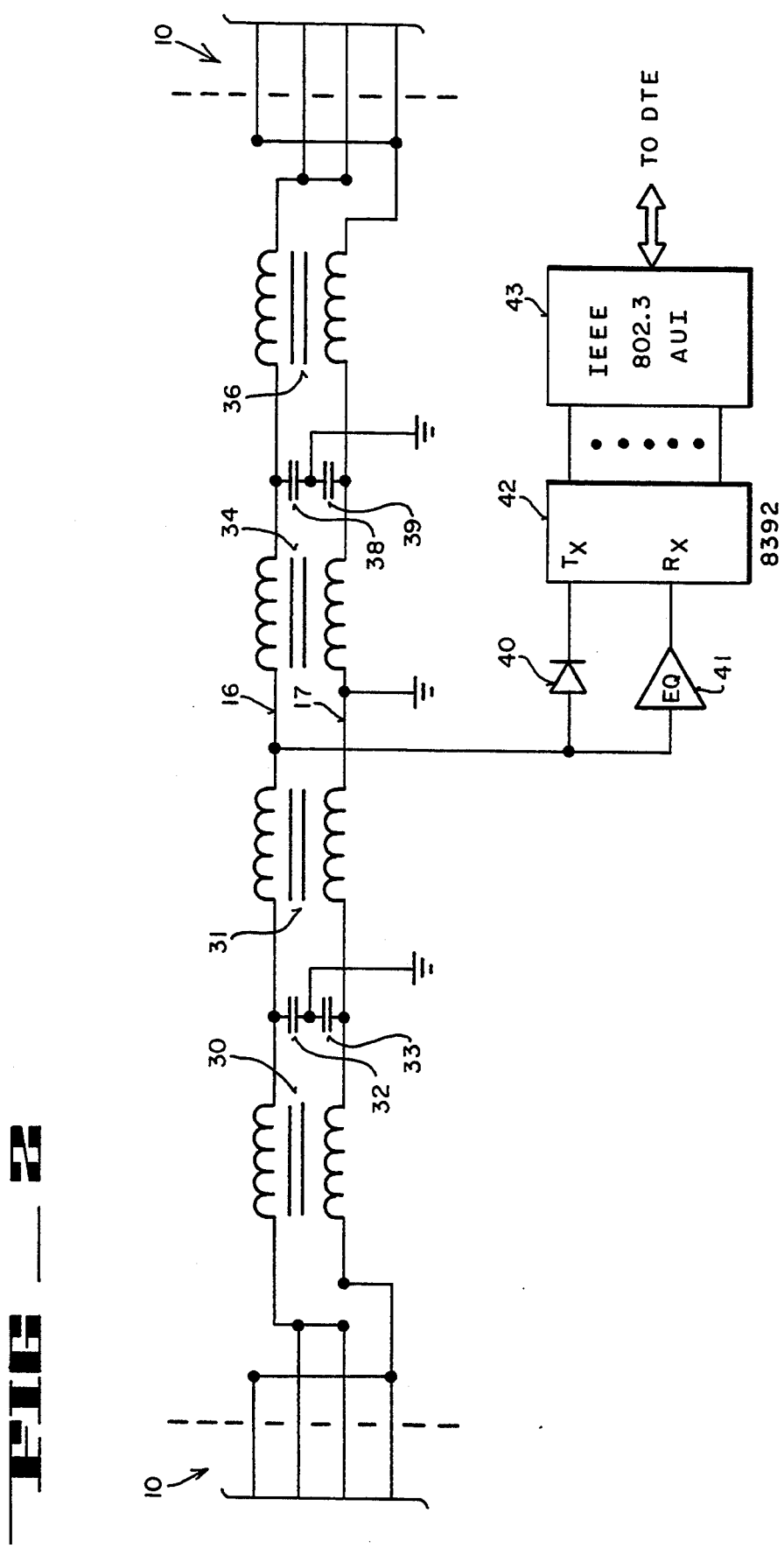
FIG—2

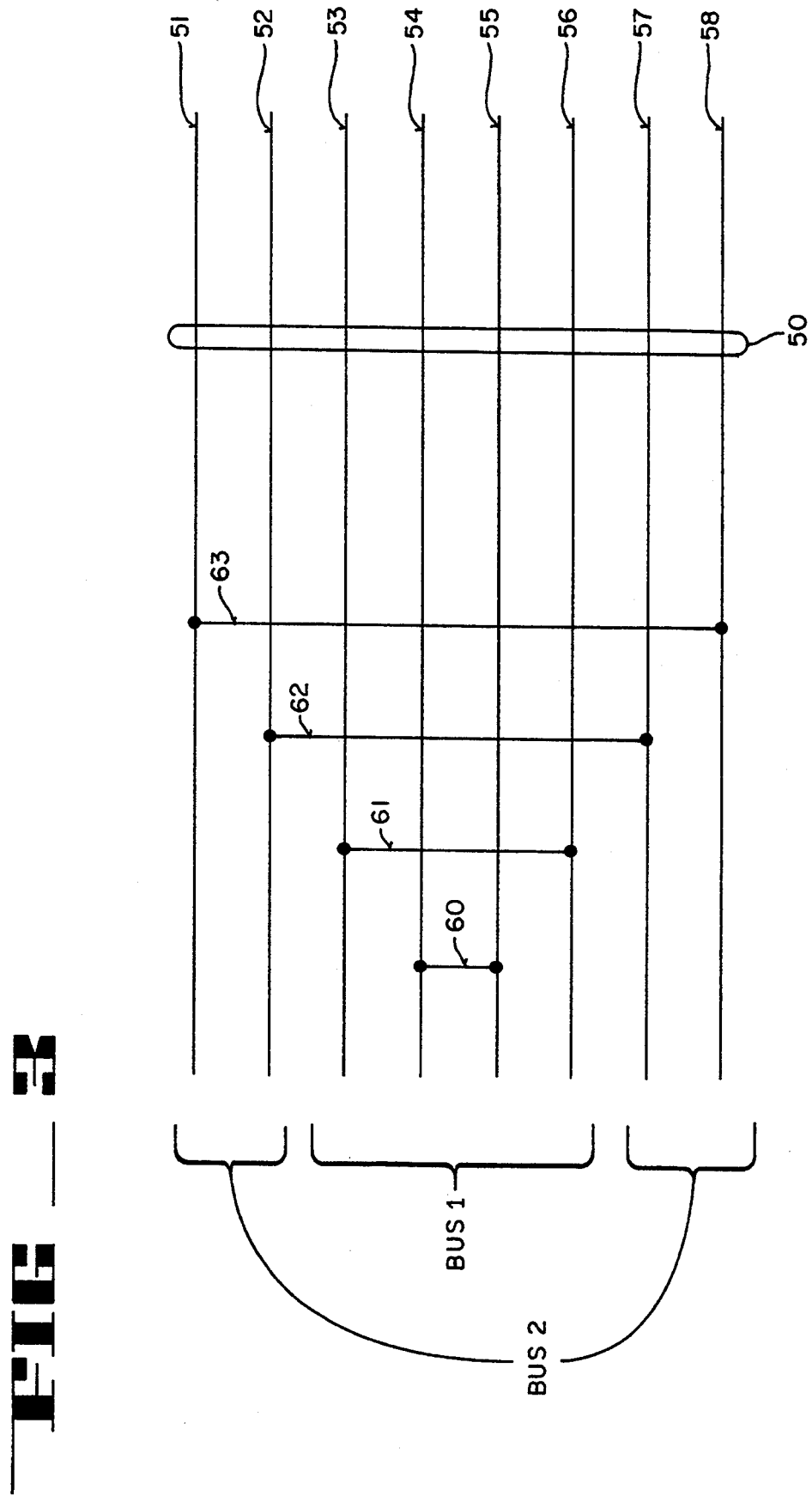

FLAT CABLE TO FLAT PARALLEL WIRE CABLE

BACKGROUND OF THE INVENTION

1. Field of the Invention

The invention relates to local area networks (LANs) and more particularly, to medium access where a flat parallel wire telephone cable is used for the medium.

2. Prior Art

Local area networks (LANs) have become widely used, particularly to interconnect personal computers, servers, peripherals, etc. Among the most popular LANs is Ethernet which often uses a 50 ohm coaxial cable or uses an unshielded twisted pair line having 100 ohm characteristic impedance.

In these networks with unshielded cables, it is often desirable that the current in the medium be balanced, that is, that the network operate in a differential mode since this prevents troublesome radiation and limits susceptibility to external electronic noise. There are numerous well-known circuits, filters, terminators, etc. for preventing radiation from and limiting the susceptibility of these networks.

As will be seen, the present invention preferably uses a flat parallel wire telephone cable which has at least four conductors. Moreover, the invention makes use of baluns, such as the baluns disclosed in U.S. Pat. No. 4,717,896.

SUMMARY OF THE INVENTION

An improved method for coupling a node into a network where the network uses a generally balanced line is described. The method makes use of a first balun and a second balun connected in series and connected into the transmission line so that the current in the line passes through the baluns. The pair of leads between the baluns forms a zone in which the line can be unbalanced without causing increased radiation or increasing the susceptibility to external noise, common mode currents can be better tolerated. Consequently, components of the medium access unit which may operate in an unbalanced mode can be connected directly to the leads.

In the preferred embodiment of the present invention, the line comprises a four conductor flat parallel wire telephone cable having two inner conductors and two outer conductors. At each of the nodes the two inner conductors are electrically connected together and the two outer conductors are electrically connected together. This provides a medium having a characteristic impedance of approximately 60 ohms. There are several advantages to this, among them is that there is no reversal of the signal polarity from node-to-node even where connectors are used that reverse the two inner conductors and reverse the two outer conductors.

BRIEF DESCRIPTION OF THE DRAWINGS

FIG. 1 shows a portion of a network fabricated in accordance with the present invention.

FIG. 2 is an electrical schematic of one node of a network fabricated in accordance with the present invention.

FIG. 3 shows the arrangement of the present invention comprising two bus lines.

DETAILED DESCRIPTION OF THE PRESENT INVENTION

An improved LAN which employs a flat parallel wire telephone cable and is particularly suited for Ethernet protocol is described. In the following description numerous specific details are set forth, such as part numbers, in order to provide a thorough understanding of the present invention. It will be obvious to one skilled in the art that the present invention may be practiced without these specific details. In other instances well-known components and parts are not described in detail in order not to unnecessarily obscure the present invention.

Referring first to FIG. 1 a portion of a LAN is illustrated which has a medium (cable) 10 supporting a node 1 defined between the dotted lines 11 and 12 and supporting a second node, node 2, partially shown to the right of the dotted line 13.

In the currently preferred embodiment, the medium 10 is a flat parallel wire telephone cable sometimes referred to as "silver-satin" that has at least four conductors; specifically, two inner conductors 18 and 19 (typically color coded red and green) and two outer conductors 20 and 21 (typically color coded yellow and black). The cable 10 in some cases may include additional outer pairs since such cabling often contains six or eight conductors.

In the presently preferred embodiment, to connect a node into the cable 10, the cable is cut or otherwise opened, the outer conductors 20 and 21 are electrically connected together and the inner conductors 18 and 19 are also connected together. This forms two leads at each end of the cut. Two of these leads are connected to a balun 14 and the other two to a balun 15. The baluns 14 and 15 are connected in series as shown by the leads 16 and 17. Thus, the baluns 14 and 15 are connected in series with the cable 10 as illustrated.

Typically the cable 10 has a characteristic impedance of approximately 100 ohms for adjacent pairs of conductors. With the conductors of cable 10 connected as shown in FIG. 1, the characteristic impedance of the cable is reduced to approximately 60 ohms. This provides several advantages which will be discussed later.

The remainder of the medium access unit (MAU 22) is connected to the leads 16 and 17. MAU 22, as is customarily done in Ethernet LANs, is connected to an attachment unit interface (AUI 23). This interface is connected to a computer, repeater or the like, sometimes generically referred to as data terminal equipment (DTE 24).

In LANs using unshielded cables, it is desirable to maintain only balanced conditions (differential mode current)in the medium to prevent electromagnetic interference both to and from the LAN. This goal is made more difficult because transceivers often introduce common mode currents into the medium. With the present invention, the baluns 14 and 15 form a zone between them where the unbalanced currents can be better tolerated since their effect on the medium is attenuated by the baluns.

The ends of the medium are terminated in 60 ohm resistors, the characteristic impedance of the cable. The two outer conductors are connected to one terminal of a resistor and the two inner conductors are connected to the other terminal of the resistor as shown in FIG. 1.

Referring now to FIG. 2, a node in accordance with the present invention is shown in more detail. The opening of a cable 10, formed to allow for the node, is again shown connected in series with two baluns. One balun comprising the bifilar chokes 30 and 31 with capacitors 32 and 33 connected between the chokes. The other balun includes the bifilar chokes 34 and 36 with capacitors 38 and 39 connected between them.

The leads 16 and 17 are again shown in FIG. 2 with the lead 17 connected to ground. The lead 16 is connected through the diode 40 to the transmit terminal of a transceiver 42. The diode 40 is typically used on the transmission terminal of transceivers, such as transceiver 42, to provide isolation to the driver transistors within the transceiver. Lead 16 also provides the received signal which is coupled to the receive signal terminal of the transceiver 42 through an equalizer 41.

In the currently preferred embodiment the transceiver comprises an integrated circuit, part number 8392, manufactured by National Semiconductor as well as other companies. (Other commercially available transceivers may be used). The output of the transceiver 42 is connected to the DTE through an attachment unit interface (AUI 43). In the currently preferred embodiment the AUI complies with IEEE Standard 802.3, 10 Base5 AUI part.

The equalizer 41 is only required where the cable 10 is very long. There is an equalizer within transceiver 42 which is adequate for many LANs. The optional equalizer 41 can be built as described in U.S. Pat. No. 5,191,300. It should provide broad band performance, for example, from DC to 15 MHz.

In the currently preferred embodiment, the baluns have low transmission loss for differential signals; this is helpful since there are two baluns for each node. Also they should have a differential impedance (e.g., 60 ohms) that matches the transmission line impedance in order to prevent mismatches between the cables and the nodes.

Referring again to the cable 10 shown in FIGS. 1 and 2, connecting the inner conductors together and the outer conductors together provides several important advantages:

A key problem in some LANs is detecting the polarity of the data. For example, where an ordinary flat telephone wire transmission line (two conductors) is used, these conductors may be reversed (red to green and green to red) at various points in the network; this is caused by some modular telephone cables that reverse the conductors. These reversals add to the problem of deciding on polarity. If multiple cables are used and some or all have reversals, the polarity of the data will vary along the length of the LAN making it difficult for individual nodes to properly interpret its sense. These reversals also cause problems when simultaneous transmissions occur since the transmissions can cancel each other, making detection of simultaneous transmissions (collisions) more difficult.

With the inner and outer conductors connected as shown in FIGS. 1 and 2 the problem of polarity reversal is eliminated. Such reversals become transparent since the inner conductors are effectively one conductor and the outer conductors are the other conductor of the medium. Even if modular telephone connectors are used that reverse the red and green leads and the yellow and black leads, polarity is not reversed.

As mentioned, with the connections shown in FIG. 1 and 2, the characteristic impedance is reduced from approximately 100 ohms to 60 ohms. Typically, 50 ohm coaxial cable is used in Ethernet applications. The difference between 50 ohms and 60 ohms is small enough to permit some circuits, particularly integrated circuits, designed for Ethernet coaxial cable to be more effectively used with the flat telephone cable as connected above. Moreover, with a 60 ohm impedance versus a 100 ohm impedance, loading of the medium by the nodes becomes less of a problem since it is easier to achieve a high ratio of load-to-cable impedance.

The cable connection discussed above may also be used for two buses as shown in FIG. 3. A flat parallel wire telephone cable 50 having two inner conductors and three outer pairs is used. The inner conductors (54, 55) are connected together (e.g., connector 60) and the pair of outer conductors (53, 56) adjacent to the inner conductors (54, 55) are also connected together (e.g., connector 61) to form one bus (BUS 1). The next outer pair of conductors (52, 57) are connected (e.g., connector 62) and the outer most pair of conductors (51, 58) are connected (e.g., connector 63) thereby forming a second bus (BUS 2).

An improved LAN has been described, particularly suitable for Ethernet applications where zones of unbalanced currents can be tolerated and where the commonly used telephone cables having at least four conductors are put to advantage.

We claim:

1. An improved method for coupling a node into a network where said network uses a generally balanced line comprising the steps of:
   providing a first balun and a second balun connected in series with said generally balanced line so as to provide a pair of leads between said first balun and said second balun;
   providing a connection directly to said pair of leads for a transceiver, such that unbalanced currents associated with said transceiver are isolated from said generally balanced line by said first balun and second balun.

2. The improved method defined by claim 1 wherein said generally balanced line has two inner conductors and two outer conductors and including the additional steps of:
   electrically connecting together said inner conductors; and
   electrically connecting together said outer conductors.

3. In an Ethernet network employing a line having at least two conductors, a method for connecting digital terminal equipment at a node to the line, comprising the steps of:
   connecting a first balun and a second balun in series with the two conductors of the line at the node such that a pair of conductors is formed between the first balun and the second balun at the node; and
   connecting the pair of conductors formed between the first balun and the second balun directly to the digital terminal equipment at the node such that unbalanced currents associated with the connecting of the digital terminal equipment are isolated between the first balun and second balun.

4. The method defined by claim 3 wherein the line has two inner conductors and two outer conductors including the additional steps of:
   electrically connecting the inner conductors together; and, electrically connecting the outer conductors together.

5. An improved method for coupling a terminal into a network where the network uses a generally flat parallel wire cable having two inner conductors and at least two outer conductors comprising the steps of:

electrically connecting together the two inner conductors of a first one of the generally flat parallel wire cable to form a first lead;

electrically connecting together the two outer conductors of the first one of the generally flat parallel wire cable adjacent to the inner conductors to form a second lead;

electrically connecting together the two inner conductors of a second one of the generally flat parallel wire cable to form a third lead;

electrically connecting together the two outer conductors of the second one of the generally flat parallel wire cable to form a fourth lead;

providing a first and a second balun connected in series;

connecting the first balun to the first and second leads;

connecting the second balun to the third and fourth leads; and, coupling the terminal between the first and second baluns.

6. A network including:

a flat parallel wire cable having two inner conductors, first outer conductors adjacent to the two inner conductors, second outer conductors adjacent to the first outer conductors and third outer conductors adjacent to the second outer conductors;

a first connection connecting the two inner conductors, a second connection connecting the first outer conductors, a third connection connecting the second outer conductors, a fourth connection connecting the third outer conductors.

7. A medium access unit for providing an interface to an opening in a flat parallel wire cable, the opening having a first and second end, the cable having two inner conductors and at least two outer conductors, comprising:

a first balun having a first and second pair of leads;
a second balun having a first and second pair of leads;
the second pair of leads of the first balun being connected to the first pair of leads of the second balun;

one of the leads of the first pair of leads of the first balun being connected to the inner conductors at one end of the opening, the other of the leads of the first pair of leads of the first balun being connected to the outer conductors at the one end of the opening;

one of the leads of the second pair of leads of the second balun being connected to the inner conductors at the other end of the opening, the other of the leads of the second pair of leads of the second balun being connected to the outer conductors at the other end of the opening.

8. A medium access unit for providing an interface in a network having a line comprising at least one pair of leads, said unit being coupled into said line at an opening in said line, said opening having a first end with a pair of leads and a second end with a pair of leads, comprising:

a first balun having a first pair of leads at a first terminal and a second pair of leads at a second terminal, said first pair of leads at said first terminal for coupling to said pair of leads of said first end of said opening;

a second balun having a third pair of leads at a third terminal and a fourth pair of leads at a fourth terminal, said fourth pair of leads at said fourth terminal for coupling to said pair of leads of said second end of said opening;

said second pair of leads at said second terminal of said first balun being connected to said third pair of leads at said third terminal of said second balun to form interconnecting leads between said first and second baluns for accepting unbalanced currents; and, a connection to said interconnection leads between said first and second balun for receiving an apparatus that is to be coupled into said network.

* * * * *

UNITED STATES PATENT AND TRADEMARK OFFICE
CERTIFICATE OF CORRECTION

PATENT NO.   :   5,379,005
DATED        :   January 3, 1995
INVENTOR(S)  :   Aden et al.

It is certified that error appears in the above-identified patent and that said Letters Patent is hereby corrected as shown below:

In column 2 at lines 41-42 delete "cutomadly" and insert -- customarily --

Signed and Sealed this

Twenty-sixth Day of August, 1997

Attest:

BRUCE LEHMAN

Attesting Officer

Commissioner of Patents and Trademarks